United States Patent
Takahashi et al.

(10) Patent No.: US 6,940,110 B2
(45) Date of Patent: Sep. 6, 2005

(54) SIC-MISFET AND METHOD FOR FABRICATING THE SAME

(75) Inventors: Kunimasa Takahashi, Osaka (JP); Osamu Kusumoto, Nara (JP); Makoto Kitabatake, Nara (JP); Masao Uchida, Osaka (JP); Kenya Yamashita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 53 days.

(21) Appl. No.: 10/716,497

(22) Filed: Nov. 20, 2003

(65) Prior Publication Data

US 2004/0104429 A1 Jun. 3, 2004

(30) Foreign Application Priority Data

Nov. 29, 2002 (JP) ......................... 2002-347183

(51) Int. Cl.[7] .................. H01L 29/76; H01L 29/94; H01L 31/062; H01L 31/113; H01L 31/119
(52) U.S. Cl. ................ 257/288; 257/548; 257/550; 438/197; 438/514; 438/518
(58) Field of Search .................. 257/288, 548, 257/550; 438/197, 514, 518

(56) References Cited

U.S. PATENT DOCUMENTS

| | | | | |
|---|---|---|---|---|
| 6,455,892 B1 | * | 9/2002 | Okuno et al. | 257/328 |
| 6,551,865 B2 | * | 4/2003 | Kumar et al. | 438/137 |
| 6,552,363 B2 | * | 4/2003 | Sridevan | 257/77 |
| 6,573,534 B1 | * | 6/2003 | Kumar et al. | 257/77 |
| 6,653,659 B2 | * | 11/2003 | Ryu et al. | 257/77 |
| 2002/0167011 A1 | * | 11/2002 | Kumar et al. | 257/77 |
| 2003/0073270 A1 | * | 4/2003 | Hisada et al. | 438/197 |

FOREIGN PATENT DOCUMENTS

JP 2001-144292 A 5/2001

* cited by examiner

Primary Examiner—Amir Zarabian
Assistant Examiner—Ida M. Soward
(74) Attorney, Agent, or Firm—McDermott Will & Emery LLP

(57) ABSTRACT

A storage-type SiC-MISFET includes a SiC substrate, an n-type drift layer, a p-type well region, an n-type source region, a SiC channel layer which contains an n-type impurity and is to be a storage-type channel layer, a p-type heavily doped contact layer, a gate insulation film, a gate electrode and the like. In the storage-type SiC-MISFET, a partially heavily doped layer is formed by partially implanting ions of a p-type impurity into an upper surface portion of the n-type drift layer and containing an impurity of the same conductive type as that of the impurity implanted into the well region at a higher concentration than that in the well region.

10 Claims, 9 Drawing Sheets

SiC-MISFET AND METHOD FOR FABRICATING THE SAME

BACKGROUND OF THE INVENTION

The present invention relates to SiC-MISFET formed using a SiC body, and more particularly relates to a storage-type SiC-MISFET and a method for fabricating a storage-type SiC-MISFET.

Silicon carbide (SiC) has a structure in which Si and C are bounds to each other with a composition ratio of 1:1, and is a wide bandgap semiconductor material which has a wider bandgap, a greater hardness, and a higher resistance to chemicals, compared to Si. SiC has higher breakdown field, even compared to other wide bandgap semiconductor materials. Therefore, application of SiC to low-loss power devices is expected. SiC includes many polytypes, such as cubic 3C-SiC, hexagonal 6H-SiC, 4H-SiC and the like. Among these polytypes, it is 6H-SiC or 4H-SiC that is generally used to fabricate a SiC-MISFET for practical use. Then, a substrate including a plane almost in accordance with the (0001) plane which is vertical to the crystallographic axis, i.e., a c-axis, as the principal surface has been widely used.

A SiC semiconductor device is formed by using an epitaxial layer formed on a SiC substrate as an active region and providing necessary regions in the active region according to the type of the active region. Among semiconductor devices, in the case of an FET, source/drain regions and a gate region are provided. Specifically, in a SiC-MISFET, i.e., an MIS (metal/insulation film/semiconductor) type FET, an MOSFET of the MOS (metal/oxide film/semiconductor) type using an oxide film formed as a gate insulation film by thermal oxidation has been widely known, in general.

On a Si layer, a silicon oxide film which is to be an excellent gate insulation film is formed by thermal oxidation. However, in the case of SiC layer, since C exists, in addition to Si, it is very difficult to form an excellent oxide film through regular oxidation. Specifically, since C exists in a silicon oxide film formed on the SiC layer, an interface level which traps a carrier with fixed charge is formed around the interface between a Si layer and an oxide film. For this reason, in an inversion type MISFET, only very small channel mobility of a carrier can be achieved in an inversion layer to be a channel layer through which current flows. Therefore, it is very difficult to make a large current flow in a SiC-MISFET. In order to solve this problem, in a power SiC-MISFET, a structure in which a storage-type channel layer containing an impurity of the same conductive type as that of a source/drain region is provided is generally used. Such MISFETs are called storage-type (or accumulation-type) SiC-MISFET (SiC-ACCUFET).

FIG. 9 is a cross-sectional view illustrating the structure of a general storage-type SiC-MISFET which has been conventionally used. As shown in FIG. 9, the general storage-type SiC-MISFET includes a SiC substrate 101, a first epitaxial layer 102a epitaxially grown on the principal surface of the SiC substrate 101, a second epitaxial layer 102b epitaxially grown on the first epitaxial layer 102a. The first epitaxial layer 102a includes an n-type body section 102c containing an n-type impurity (dopant) formed on the principal surface of the SiC substrate 101, a p-type well region 103 formed by implanting ions of a p-type impurity into the n-type body section 102c, and a heavily doped contact layer 109 containing the p-type impurity at a higher concentration than that in the well region 103. Moreover, the epitaxial layer 102b is formed so that part thereof extends over the well region 103 and the n-type body section 102c. The part of the epitaxial layer 102b forms a SiC channel layer 105, i.e., a storage-type channel layer containing an n-type impurity. Furthermore, the general storage-type SiC-MISFET includes an n-type source region 104 formed by implanting ions of an n-type impurity into parts of the second epitaxial layer 102b and the well region 103. Moreover, the general storage-type SiC-MISFET includes a gate insulation film 106 provided on the SiC channel layer 105, a gate electrode 113 formed on the gate insulation film 106, a source electrode 111 which forms an ohmic contact with the source region 104 and the heavily doped contact layer 109, and a drain electrode 112 which forms an ohmic contact with a surface of the SiC substrate 101 opposing to the principal surface (back surface) thereof The source region 104 is formed so as to overlap with the gate electrode 113 when viewed from the top and be in contact with the heavily doped contact layer 109 (e.g., see Japanese Laid Open Patent Publication No. 2001-144292).

SUMMARY OF THE INVENTION

However, the following problem arises in the known storage-type SiC-MISFET.

There have been cases where the known storage-type SiC-MISFET of FIG. 9 becomes in a normally ON state in which a current flows between the source and drain when a voltage is not applied to the gate. This seems to occur because with a voltage of 0 V applied between the gate electrode 113 and the well region 103, a conductive state is created between the n-type source region 104 and the n-type epitaxial layer 102 at the n-type SiC channel layer 105. In such a normally-ON storage-type MISFET, in order to prevent flow of a drain current in an OFF state, it is necessary to apply a negative bias voltage to the gate electrode in an OFF state so that a depletion layer in the SiC channel layer reaches the gate insulation film to make the MISFET be in a pinch-OFF state.

Therefore, the impurity concentration of the SiC channel layer 105 is reduced so that a depletion layer formed in the SiC channel layer reaches the gate insulation film (a first measure) or the impurity concentration of the p-type well region 103 is increased (a second measure). However, in the case of the first measure, since the carrier concentration in the SiC channel layer is reduced, only a drain current with a small current density can be achieved in an ON state with a positive voltage applied to the gate electrode. Moreover, in the case of the second measure, since the impurity concentration of the p-type well region is high, influence of impurity scattering becomes larger. Thus, the channel mobility of electrons is reduced, so that ON resistance is increased. Therefore, it is difficult to achieve a drain current with a high current density. That is to say, even if a normally OFF state is achieved using either one of the first and second measures, it is very difficult to make a drain current with a high current density flow.

As has been described, when the structure of the known storage-type SiC-MISFET is used, there is a trade-off relationship between a drain current with a high current density and a normally OFF state. Thus, it has been very difficult to achieve both of a drain current with a high current density and a normally OFF state at the same time. Therefore, it is desired to realize a storage-type MISFET in which a current does not flow between the source and the drain when a voltage is not applied to the gate electrode, i.e., in an OFF state, and a drain current with a high current density flows when a positive voltage is applied to the gate electrode, i.e., in an ON state. In short, it is desired to achieve a storage-type MISFET with excellent current driving ability.

In view of the above-described problems, it is an object of the present invention to provide, while achieving a normally OFF state, a SiC-MISFET with an excellent current driving ability and a method for fabricating the SiC-MISFET.

A SiC-MISFET according to the present invention is a SiC-MISFET in which a body portion containing an impurity of a first conductive type or a partially heavily doped layer which is surrounded by a well region containing an impurity of a second conductive type and contains the impurity of the second conductive type at a high concentration is provided directly under a channel layer.

Thus, when the storage-type SiC-MISFET is in an OFF state, i.e., a voltage applied between a gate and a well is 0 V, a current flowing through the channel layer is suppressed, whereas when the storage-type SiC-MISFET is in an ON state, a drain current with a high current density can be made to flow while a normally OFF state is achieved. A possible reason for this seems that a depletion layer is enlarged in part of the channel layer.

In this case, if a depletion layer formed in the channel layer in an OFF state reaches a gate insulation film, a current can be reliably shut down by the depletion layer.

When the partially heavily doped layer is formed by injecting an impurity of the second conductive type into the body portion, the space between the partially heavily doped layer and the well region is shorter than a dimension of the partially heavily doped layer in the gate length direction. Thus, the potential of the partially heavily doped layer can be easily fixed, so that the depletion layer is enlarged more efficiently.

If the partially heavily doped layer is provided in the well region, the potential of the partially heavily doped layer is fixed. Thus, a depletion layer which completely pinches off the SiC channel layer can be formed in a simple manner, so that a normally OFF SiC-MISFET can be achieved without reducing a drain current in an ON state.

More specifically, if a heavily doped contact layer is provided in part of the well region, the heavily doped contact layer is formed so as to surround the source region from underside of the source region and the partially heavily doped layer is part of the heavily doped contact layer. Thus, it is possible to make fabrication process steps simple.

A dimension of the partially heavily doped layer in the gate length direction is one tenth or less of a dimension of the channel layer in the gate length direction. Thus, the influence of scattering of the impurity contained in the partially heavily doped layer can be suppressed to be within a permitted limit.

A dimension of the partially heavily doped layer in the depth direction is larger than a dimension of the channel layer in the depth direction. Thus, a depletion layer formed in the channel layer in an OFF state reaches the gate insulation film, so that a current can be reliably shut down.

The impurity concentration of the partially heavily doped layer is ten times or more higher than that of the well region. Thus, a depletion layer in which a current can be reliably shut down in an OFF state can be formed in the channel layer.

The SiC-MISFET of the present invention may have a vertical type MISFET structure and also may have a horizontal type MISFET structure.

A method for fabricating a SiC-MISFET according to the present invention includes the steps of: by implanting an impurity of the second conductive type into a SiC body to form a well region; implanting an impurity of the second conductive type into the SiC body at a higher concentration than that in the well region to form a partially heavily doped layer; and epitaxially growing a channel layer containing an impurity of the first conductive type over the body portion of the SiC body, the well region and the partially heavily doped layer.

With this method, the structure of the SiC-MISFET can be obtained in a simple manner.

More specifically, an impurity of the second conductive type is implanted using an implantation mask having an opening corresponding a region of the substrate in which the source region is to be formed, thereby forming the partially heavily doped layer so as to be in contact with the source region. Thus, it is possible to make fabrication process steps simple.

DESCRIPTION OF THE PREFERRED EMBODIMENTS (First Embodiment)

First, a storage-type SiC-MISFET according to a first embodiment of the present invention in which a partially heavily doped layer containing an impurity at a higher concentration than that in a well region is provided in a drift layer will be described.

Figure 1:
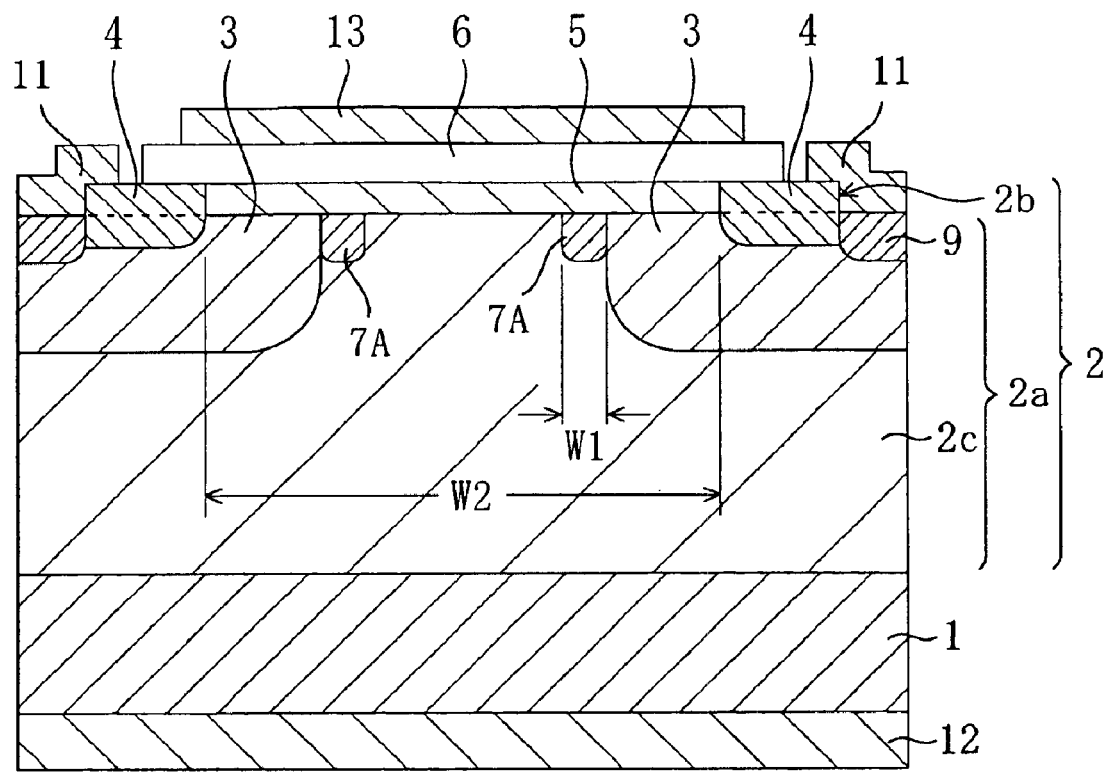
FIG. 1 is a cross-sectional view illustrating the structure of a storage-type SiC-MISFET according to a first embodiment of the present invention.

FIG. 1 is a cross-sectional view illustrating the structure of the storage-type SiC-MISFET of the first embodiment. As shown in FIG. 1, the storage-type SiC-MISFET of this embodiment includes a SiC substrate 1, a first epitaxial layer 2a epitaxially grown on the principal surface of the SiC substrate 1, and a second epitaxial layer 2b epitaxially grown on the first epitaxial layer 2a. The first epitaxial layer 2a includes an n-type drift layer 2c (body section) containing an n-type impurity (dopant) formed on the principal surface of the SiC substrate 1, a p-type well region 3 formed by implanting ions of a p-type impurity into the n-type drift layer 2c, and a heavily doped contact layer 9 containing a p-type impurity at a higher concentration than that in the well region 3. Moreover, the second epitaxial layer 2b is formed so that part thereof extends over the well region 3 and the n-type drift layer 2c. The part of the second epitaxial layer 2b forms a SiC channel layer 5, i.e., a storage-type channel layer containing an n-type impurity. Furthermore, the storage-type SiC-MISFET further includes an n-type source region 4 formed by implanting ions of an n-type impurity into another part of the second epitaxial layer 2b and part of the well region 3. Moreover, the storage-type SiC-MISFET further includes a gate insulation film 6 provided on the SiC channel layer 5, a gate electrode 13 provided on the gate insulation film 6, a source electrode 11 which forms an ohmic contact with the source region 4 and the heavily doped contact layer 9, and a drain electrode 12 which forms an ohmic contact with a surface of the SiC substrate 1 opposing to the principal surface (back surface) thereof The source region 4 is formed so as to overlap with the gate electrode 13 when viewed from the top and to be in contact with the heavily doped contact layer 9.

Although the heavily doped contact layer 9 is not necessarily provided, it is preferable to provide the heavily doped contact layer 9 in order to ensure ohmic characteristics of the source electrode 11 for applying bias to the well region 3.

When the storage-type SiC-MISFET of this embodiment is operated, a current flows from the source region 4 to the SiC substrate 1 (drain region) via the SiC channel layer 5 and the n-type drift layer 2c. Therefore, the storage-type SiC-MISFET of this embodiment has a vertical type MISFET structure.

The structure of the storage-type SiC-MISFET of this embodiment differs from that of the known storage-type SiC MISFET in that a partially heavily doped layer 7A formed by partially implanting ions of a p-type impurity into the upper surface portion of the n-type drift layer 2c is provided. In this embodiment, the partially heavily doped layer 7A is adjacent to the well region 3 and contains an impurity of the same conductive type (p-type impurity in this embodiment) as that of the well region 3 at a concentration 10 times higher than that in the well region 3.

In this embodiment, the SiC substrate 1 and the epitaxial layer 2 including the first and second epitaxial layers 2a and 2b functions as a SiC body. However, it is also possible to form an n-type storage channel layer in an upper portion of the first epitaxial layer 2a by ion implantation without providing the second epitaxial layer 2b. In such a case, the first epitaxial layer 2b and the SiC substrate 1 become a SiC body. Moreover, it is also possible to provide a well region, a source region, and a storage channel layer in an upper potion of the SiC substrate 1 without providing any epitaxial layer. In such a case, the SiC substrate 1 becomes a SiC body.

Next, a method for fabricating the storage-type SiC-MISFET according to this embodiment will be described. FIGS. 2A through 2D are cross-sectional views illustrating respective process steps for fabricating the SiC-MISFET of this embodiment.

Figure 2A:
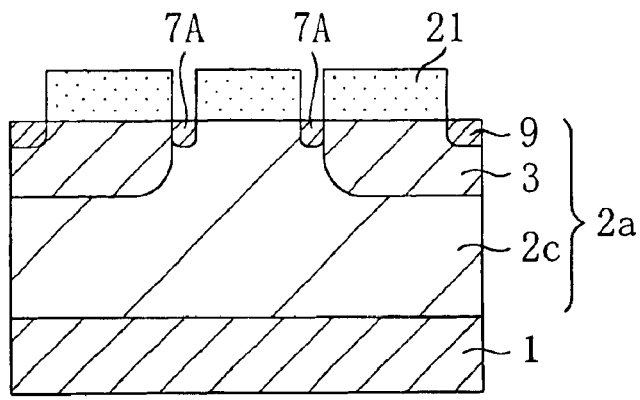
FIGS. 2A through 2D are cross-sectional views illustrating respective process steps for fabricating the SiC-MISFET of the first embodiment.

Before a process step shown in FIG. 2A, the following process step is performed. First, a SiC substrate 1 is prepared. As the SiC substrate 1, for example, a 4H—SiC substrate which has a diameter of 50 mm and whose principal surface has an off-angle of 8 degree from the (0001) plane in the [11-20] direction is used. The SiC substrate is doped with an n-type impurity and the carrier concentration is $1 \times 10^{18}$ kg cm$^{-3}$. Next, while performing in-situ doping with an n-type impurity by CVD, a first epitaxial layer 2a of a storage-type SiC-MISFET including an n-type drift layer 2c is epitaxially grown on the SiC substrate 1. The thickness of the first epitaxial layer 2a (the thickness of the n-type drift layer 2c) is about 10 μm and the carrier concentration of the n-type drift layer 2c is about $5 \times 10^{15}$ cm$^{-3}$. Thus, a SiC body lower layer including the SiC substrate 1 and the first epitaxial layer 2a is formed.

Subsequently, to form a well region 3 of the storage-type SiC-MISFET, an implantation mask (not shown) made of, for example, nickel (Ni) is formed on a surface of the n-type drift layer 2c. The implantation mask covers part of the n-type drift layer 2c and has an opening corresponding to a region of the substrate in which the well region 3 is to be formed. After multiple-stage ion implantation of Al into the n-type drift layer 2c has been performed from above the implantation mask, activation annealing is performed. Thus, part of the n-type drift layer 2c becomes a p-type well region 3 with a carrier concentration of $1 \times 10^{17}$ cm$^{-3}$.

Next, in the process step of FIG. 2A, after the implantation mask of Ni has been removed, an implantation mask 21 made of Al and having openings corresponding to regions of the substrate in which a partially heavily doped layer 7A is to be formed and in which the highly doped contact layer 9 is to be formed is formed. Then, after multiple-stage ion implantation of Al ions into the n-type drift layer 2c has been performed from above the implantation mask 21, activation annealing is performed. Thus, a p-type partially heavily doped layer 7A with a carrier concentration of about $2 \times 10^{18}$ cm$^{-3}$ is formed in the n-type drift layer 2c so as to be in contact with the well region 3. Moreover, a heavily doped contact layer 9 containing a p-type impurity at about the same concentration as that of the partially heavily doped layer 7A is formed so as to be surrounded by the well region 3.

Figure 2B:
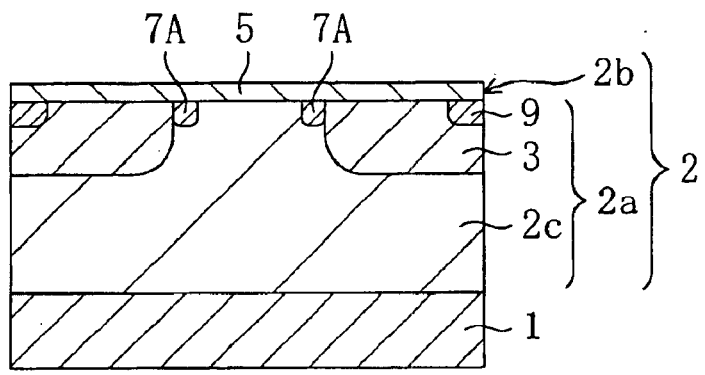

Next, in a process step shown in FIG. 2B, a second epitaxial layer 2b (a SiC body upper layer) including a SiC channel layer 5 containing an n-type impurity and having a thickness of 0.3 μm is epitaxially grown over the surfaces of the well region 3 and the n-type drift layer 2c. The n-type impurity is also introduced into the SiC channel layer 5 through in-situ doping, so that the concentration of the n-type impurity therein is about $5 \times 10^{17}$ cm$^{-3}$. Thus, a SiC body including an epitaxial layer 2 and the SiC substrate 1 is formed.

Figure 2C:
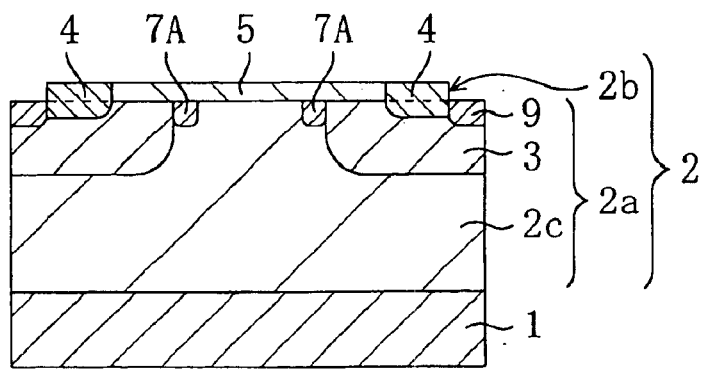

Next, in a process step shown in FIG. 2C, an implantation mask (not shown) made of Ni or the like and having an opening corresponding to a region of the substrate in which a source region 4 is to be formed is formed. After ions of nitrogen which is an n-type impurity have been implanted into the well region 3 from above the implantation mask, activation annealing of nitrogen is performed. Thus, parts of the SiC channel layer 5 and the well region 3 together form an n-type source region 4 with a carrier concentration of $1 \times 10^{18}$ cm$^{-3}$.

In this embodiment, the respective sizes of the implantation masks used in the process steps of FIGS. 2A through 2C are adjusted, so that the SiC channel layer 5 formed on the well region 3 has a width of about 10 μm and the partially heavily doped layer 7A has a width of 0.5 μm and a depth of 0.5 μm.

Figure 2D:
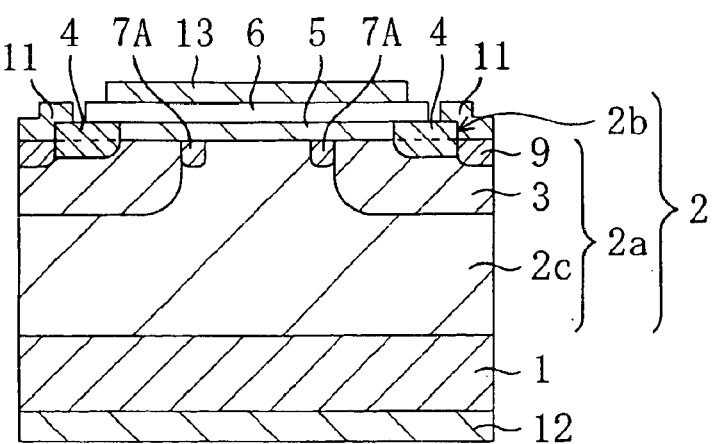

Next, in a process step shown in FIG. 2D, part of surface of the SiC body exposed is thermally oxidized at 1100° C., thereby forming a gate insulation film 6 with a thickness of 30 nm on the upper surface of the substrate. Thereafter, part of the gate insulation film 6 located in a region of the substrate in which a source electrode is to be formed has been removed, Ni is deposited on the upper surface of the source region 4 and the back surface of the SiC substrate 1 by evaporation using an electron beam (EB) evaporation system. Subsequently, by heating the SiC body at 1000° C. in a heat furnace, a source electrode 11 which is to be a first ohmic electrode and a drain electrode 12 which is to be a second ohmic electrode are formed on the source region 4 and the back surface of the SiC substrate 1, respectively. Finally, an aluminum film is deposited on the gate insulation film 6 by evaporation and then the aluminum film is patterned to form a gate electrode 13.

Next, current-voltage characteristics were measured to examine performance of the storage-type SiC-MISFET of this embodiment. The results of the measurements will be described.

Figure 9:
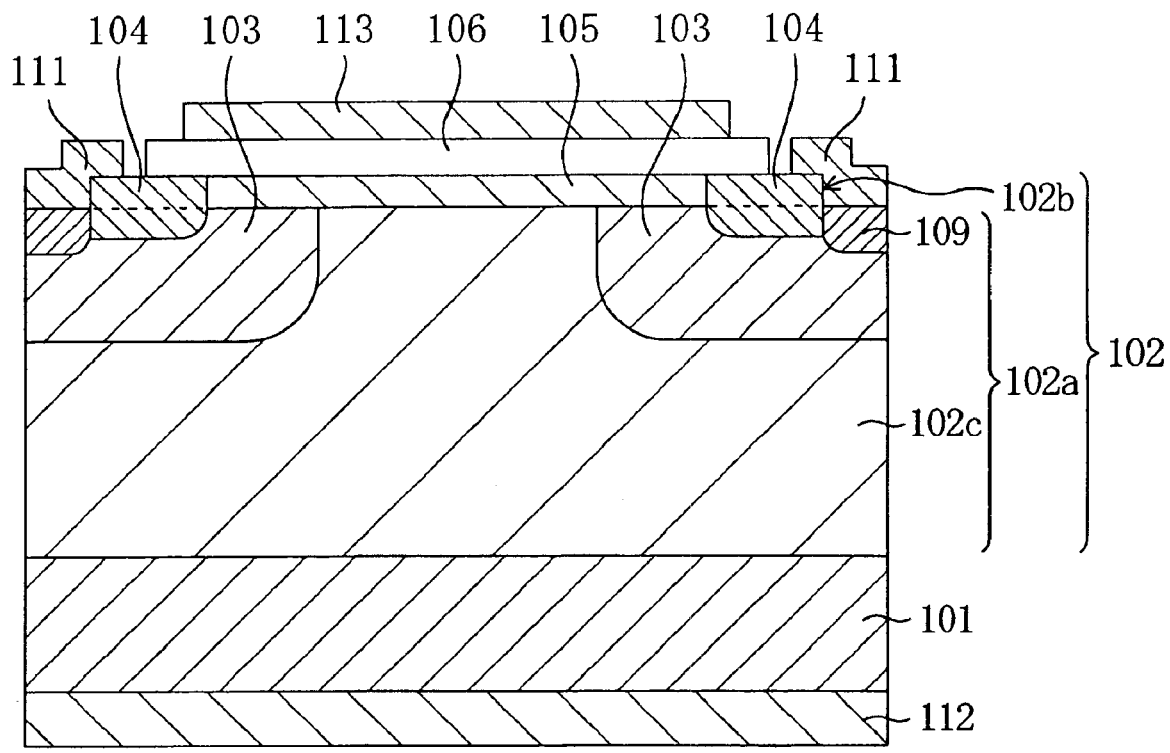
FIG. 9 is a cross-sectional view illustrating the structure of a known storage-type SiC-MISFET.

For comparison, a known storage-type SiC-MISFET shown in FIG. 9 was prepared. Note that except that the partially heavily doped layer 9a is not provided, the known storage-type SiC-MISFET was made to have the same structure as that of the storage-type SiC-MISFET of this embodiment.

Then, current-voltage characteristics of the storage-type SiC-MISFET of this embodiment and the known storage-type SiC-MISFET were examined. Specifically, a drain current was measured with a voltage of 0 V applied between the gate electrode and the well region in each of the storage-type SiC-MISFET of this embodiment and the known storage-type SiC-MISFET, and then obtained results were compared.

As a result, it has been clearly shown that in the storage-type SiC-MISFET of this embodiment, a drain current was suppressed by almost two digits, compared to the known storage-type SiC-MISFET. Note that it has been also shown that in an ON state with a positive voltage with respect to the well region applied to a gate, the respective drain currents of the storage-type SiC-MISFET of this embodiment and the known storage-type SiC-MISFET were almost the same. A possible reason for this seems to be as follows.

First, in the known storage-type SiC-MISFET, in a state (in an OFF state) in which a voltage of 0 V is applied between the gate electrode 13 and the well region 3, a depletion layer formed in the SiC channel layer 5 does not reach the gate insulation film 6. Accordingly, a conductive state is created between the source and the drain in many cases. In such a state, the known storage type SiC-MISFET becomes to be in a normally ON state. Therefore, even if a gate bias is 0V, a drain current flows.

In contrast, in the storage-type SiC-MISFET of this embodiment, with the partially heavily doped layer 7A containing a p-type impurity at a higher concentration than that in the well region 3, a depletion layer formed in the SiC channel layer 5 almost reaches the gate insulation film 6. This seems to be a reason for a shutdown between the source and the drain. Thus, the storage type SiC-MISFET becomes to be in a normally OFF state. Therefore, when a gate bias is 0V, a drain current does not flow.

In this case, in a heavily doped region of the p-type partially heavily doped layer 7A, the channel mobility of electrons might be reduced due to influence of impurity scattering. However, it is considered that by reducing the width W1 of the partially heavily doped layer 7A shown in FIG. 1 by one digit or more, compared to the width W2 of the well region 3, influence on a drain current in an ON state can be ignored.

Moreover, a dimension of the partially heavily doped layer 7A in the depth direction is greater than that of the SiC channel layer 5, so that a depletion layer formed in the SiC channel layer 5 reliably reaches the gate insulation film 6.

From the results described above, it has been shown that by providing the p-type partially heavily doped layer 7A in the n-type drift layer 2c so as to be in contact with the well region 3, a storage-type SiC-MISFET of the normally OFF type in which a drain current in an ON state is not reduced and a drain current does not flow with a voltage of 0 V applied between the gate electrode 13 and the well region 3 can be obtained.

Modified Example of First Embodiment

Figure 3:
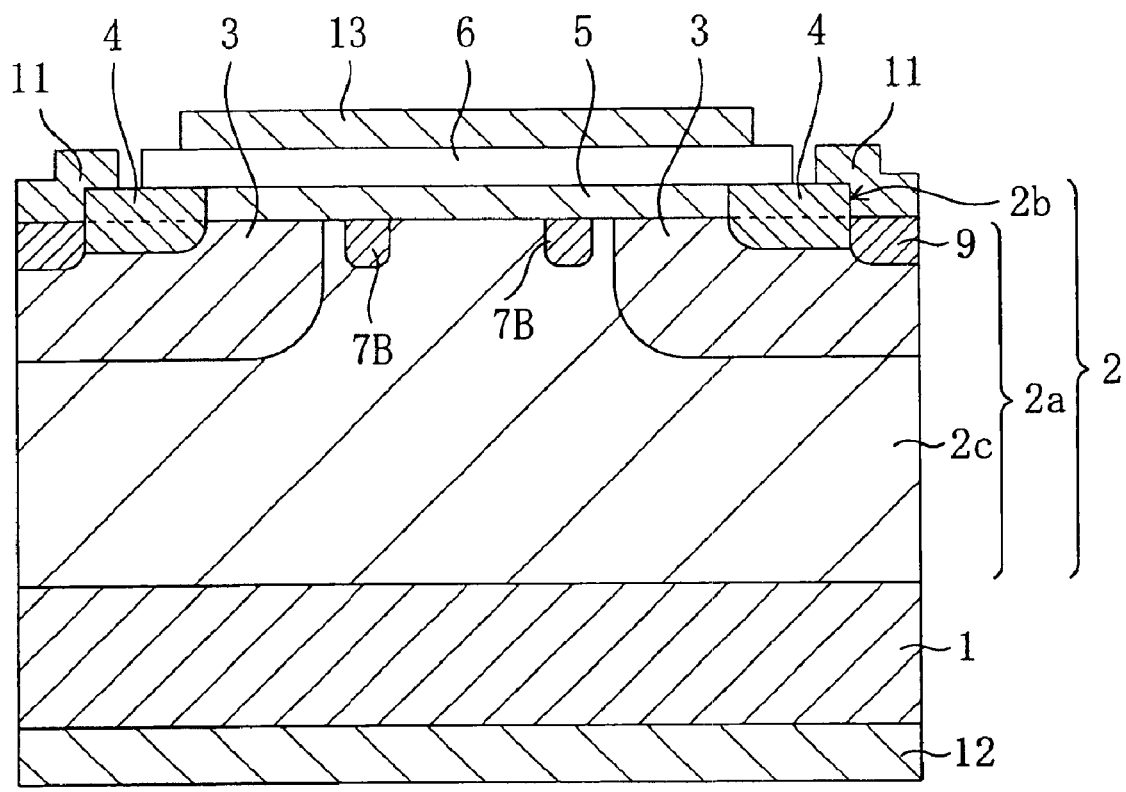
FIG. 3 is a cross-sectional view illustrating the structure of a storage-type SiC-MISFET according to a modified example of the first embodiment.

FIG. 3 is a cross-sectional view illustrating the structure of a storage-type SiC-MISFET according to a modified example of the first embodiment. In the modified example, a partially heavily doped layer 7B is not in contact with a well region 3 in an n-type drift layer 2c. The structures of other parts are the same as those of the first embodiment. In the modified example, a storage-type SiC-MISFET of the normally OFF type in which a drain current in an ON state is not reduced and a drain current does not flow with a voltage of 0 V applied between the gate electrode 13 and the well region 3 can be obtained, as in the first embodiment.

In this modified example, the space between the partially heavily doped layer 7B and the well region 3 is shorter than a dimension of the partially heavily doped layer in the gate length direction. Thus, the potential of the partially heavily doped layer is reliably fixed. Therefore, the above-described effect can be reliably achieved.

Specifically, as in the first embodiment, when the partially heavily doped layer is in contact with the well region 3 in the n-type drift layer 2c, the potential of the partially heavily doped layer can be more reliably fixed. In such a structure, the SiC channel layer 5 can be pinched off more reliably, and therefore this structure is more preferable.

(Second Embodiment)

Next, a storage-type SiC-MISFET according to a second embodiment of the present invention in which a partially heavily doped layer containing an impurity at a higher concentration than that in a well region is provided in the well region will be described.

Figure 4:
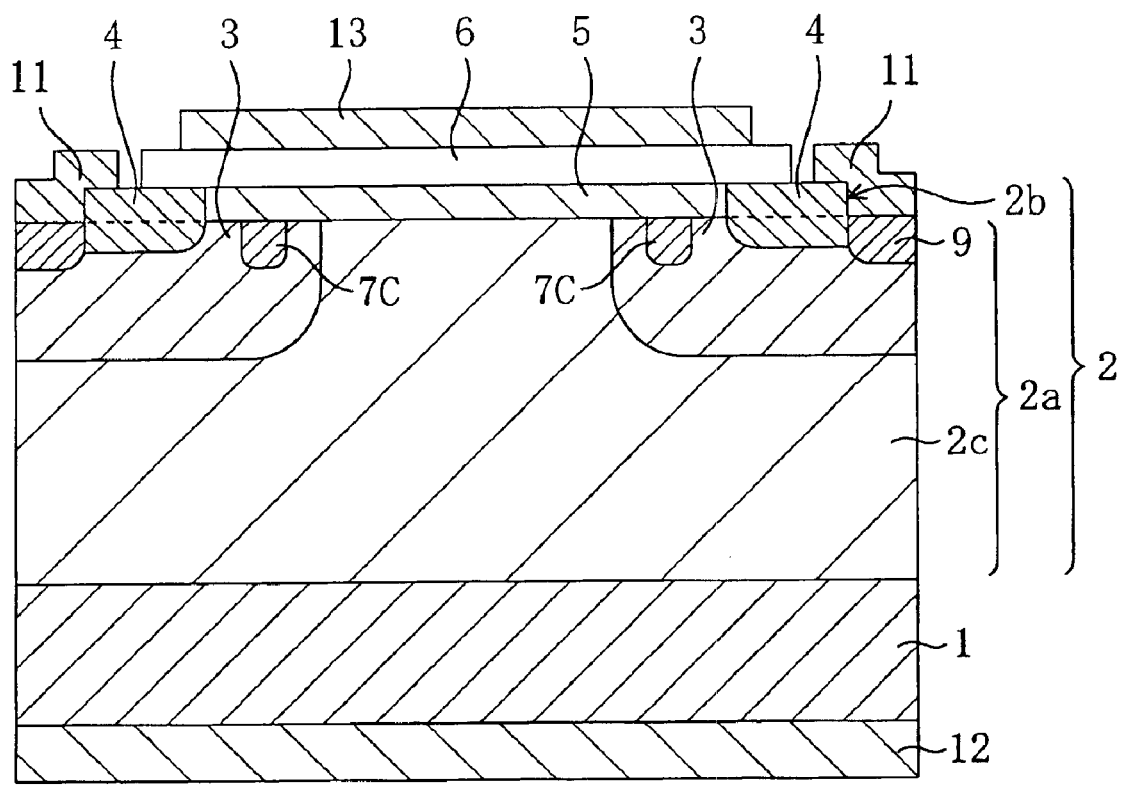
FIG. 4 is a cross-sectional view illustrating the structure of a storage-type SiC-MISFET according to a second embodiment of the present invention.

FIG. 4 is a cross-sectional view illustrating the structure of the storage-type SiC-MISFET of the second embodiment. As shown in FIG. 4, the storage-type SiC-MISFET of this embodiment includes a SiC substrate 1, a first epitaxial layer 2a epitaxially grown on the principal surface of the SiC substrate 1, and a second epitaxial layer 2b epitaxially grown on the first epitaxial layer 2a. The first epitaxial layer 2a includes an n-type drift layer 2c containing an n-type impurity (dopant) formed on the principal surface of the SiC substrate 1, a p-type well region 3 formed by implanting ions of a p-type impurity into the n-type drift layer 2c, and a heavily doped contact layer 9 containing a p-type impurity at a higher concentration than that in the well region 3. Moreover, the second epitaxial layer 2b is formed so that part thereof extends over the well region 3 and the n-type drift layer 2c. The part of the second epitaxial layer 2b forms a SiC channel layer 5, i.e., a storage-type channel layer containing an n-type impurity. Furthermore, the storage-type SiC-MISFET further includes an n-type source region 4 formed by implanting ions of an n-type impurity into another part of the second epitaxial layer 2b and part of the well region 3. Moreover, the storage-type SiC-MISFET further includes a gate insulation film 6 provided on the SiC channel layer 5, a gate electrode 13 provided on the gate insulation film 6, a source electrode 11 which forms an ohmic contact with the source region 4 and the heavily doped contact layer 9, and a drain electrode 12 which forms an ohmic contact with a surface of the SiC substrate 1 opposing to the principal surface (back surface) thereof The source region 4 is formed so as to overlap with the gate electrode 13 when viewed from the top and to be in contact with the heavily doped contact layer 9.

When the storage-type SiC-MISFET of this embodiment is operated, a current flows from the source region 4 to the SiC substrate 1 (drain region) via the SiC channel layer 5 and the n-type drift layer 2c. Therefore, the storage-type SiC-MISFET of this embodiment has a vertical type MISFET structure.

The structure of the storage-type SiC-MISFET of this embodiment differs from that of the storage-type SiC MISFET of the first embodiment in that a partially heavily doped layer 7C formed by partially implanting ions of a p-type impurity into the upper surface portion of the well region 3 is provided. In this embodiment, the partially heavily doped layer 7C contains an impurity of the same conductive type (a p-type impurity in this embodiment) as that of the well region 3 at a concentration 10 times higher than that in the well region 3.

Most of process steps for fabricating the storage-type SiC-MISFET according to this embodiment are the same as those for fabricating the storage-type SiC-MISFET of the first embodiment. Therefore, illustration of the process steps of this embodiment will be omitted and only different points will be described.

In the process steps of this embodiment, in a process step shown in FIG. 2A, ion implantation is performed using an implantation mask having openings over the well region 3, thereby forming the heavily doped contact layer 9 and the partially heavily doped layer 7C. The other process steps are the same as those shown in FIGS. 2A through 2D and description thereof.

Then, current-voltage characteristics of the storage-type SiC-MISFET of this embodiment and the known storage-type SiC-MISFET of FIG. 9 were examined. Specifically, a drain current was measured with a voltage of 0V applied between the gate electrode and the well region in each of the storage-type SiC-MISFET of this embodiment and the known storage-type SiC-MISFET, and then obtained results were compared.

As a result, it has been clearly shown as in the first embodiment that in the storage-type SiC-MISFET of this embodiment, a drain current was suppressed by almost two digits, compared to the known storage-type SiC-MISFET. Note that it has been also shown that in an ON state with a positive voltage with respect to the well region 3 applied to a gate electrode 13, the respective drain currents of the storage-type SiC-MISFET of this embodiment and the known storage-type SiC-MISFET were almost the same. A possible reason for this seems to be the same as that in the first embodiment.

From the results described above, it has been shown that by providing the p-type partially heavily doped layer 7C in the well region 3, a storage-type SiC-MISFET of the normally OFF type in which a drain current in an ON state is not reduced and a drain current does not flow with a voltage of 0V applied between the gate electrode 13 and the well region 3 can be obtained.

Modified Example of Second Embodiment

Figure 5:
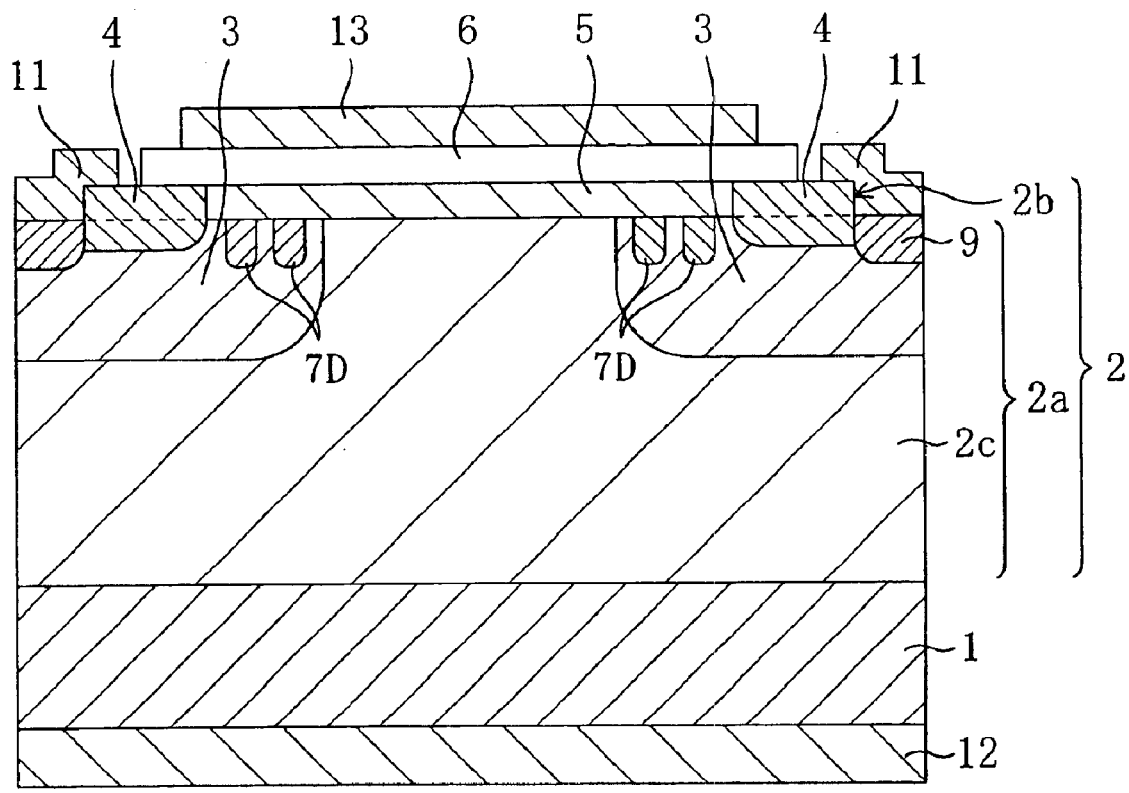
FIG. 5 is a cross-sectional view illustrating the structure of a storage-type SiC-MISFET according to a modified example of the second embodiment.

FIG. 5 is a cross-sectional view illustrating the structure of a storage-type SiC-MISFET according to a modified example of the second embodiment. In the modified example, two partially heavily doped regions 7D are provided in a well region 3. The structures of other parts are the same as those of the second embodiment. In the modified example, as in the second embodiment, a storage-type SiC-MISFET of the normally OFF type in which a drain current in an ON state is not reduced and a drain current does not flow with a voltage of 0V applied between the gate electrode 13 and the well region 3 can be obtained.

As in this modified example, when a plurality of partially heavily doped layers are provided in a well region 3, a storage-type SiC-MISFET in which the SiC channel layer can be more reliably pinched off can be obtained, and therefore this structure is preferable.

Third Embodiment

Next, a storage-type SiC-MISFET according to a third embodiment of the present invention in which a partially heavily doped layer containing an impurity at a higher concentration than that in a well region is provided in the well region will be described.

Figure 6:
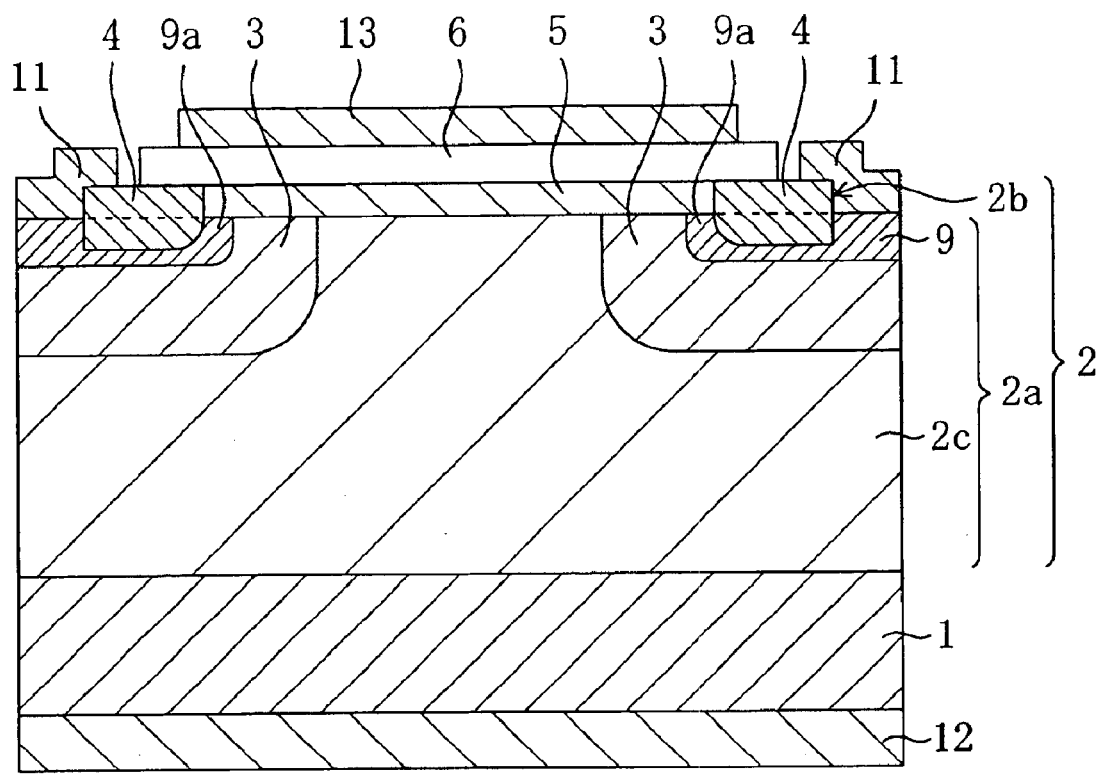
FIG. 6 is a cross-sectional view illustrating the structure of a storage-type SiC-MISFET of a third embodiment of the present invention.

FIG. 6 is a cross-sectional view illustrating the structure of the storage-type SiC-MISFET of the third embodiment. As shown in FIG. 6, the storage-type SiC-MISFET of this embodiment includes a SiC substrate 1, a first epitaxial layer 2a epitaxially grown on the principal surface of the SiC substrate 1, and a second epitaxial layer 2b epitaxially grown on the first epitaxial layer 2a. The first epitaxial layer 2a includes an n-type drift layer 2c containing an n-type impurity (dopant) formed on the principal surface of the SiC substrate 1, a p-type well region 3 formed by implanting ions of a p-type impurity into the n-type drift layer 2c, and a heavily doped contact layer 9 containing a p-type impurity at a higher concentration than that in the well region 3. Moreover, the second epitaxial layer 2b is formed so that part thereof extends over the well region 3 and the n-type drift layer 2c The part of the second epitaxial layer 2b forms a SiC channel layer 5, i.e., a storage-type channel layer containing an n-type impurity. Furthermore, the storage-type SiC-MISFET further includes an n-type source region 4 formed by implanting ions of an n-type impurity into another part of the second epitaxial layer 2b and part of the well region 3. Moreover, the storage-type SiC-MISFET further includes a gate insulation film 6 provided on the SiC channel layer 5, a gate electrode 13 provided on the gate insulation film 6, a source electrode 11 which forms an ohmic contact with the source region 4 and the heavily doped contact layer 9, and a drain electrode 12 which forms an ohmic contact with a surface of the SiC substrate 1 opposing to the principal surface (back surface) thereof. The source region 4 is formed so as to overlap with the gate electrode 13 when viewed from the top and to be in contact with the heavily doped contact layer 9.

When the storage-type SiC-MISFET of this embodiment is operated, a current flows from the source region 4 to the SiC substrate 1 (drain region) via the SiC channel layer 5 and the n-type drift layer 2c. Therefore, the storage-type SiC-MISFET of this embodiment has a vertical type MISFET structure.

The structure of the storage-type SiC-MISFET of this embodiment differs from that of the storage-type SiC MISFETs of the first and second embodiments in that the heavily doped contact layer 9 formed by partially implanting ions of a p-type impurity into an upper surface portion of the well region 3 is provided so as to surround the source region 4 and a region of the heavily doped contact layer 9 located under the SiC channel layer 5 is a partially heavily doped contact layer 9a. In this embodiment, the partially heavily doped contact layer 9a is part of the heavily doped contact layer 9, and therefore the partially heavily doped contact layer 9a contains an impurity of the same conductive type (a p-type impurity in this embodiment) as that of the well region 3 at a concentration 10 times higher than that in the well region 3.

Next, a method for fabricating the storage-type SiC-MISFET according to this embodiment will be described. FIGS. 7A through 7D are cross-sectional views illustrating respective process steps for fabricating the SiC-MISFET of this embodiment.

Figure 7A:
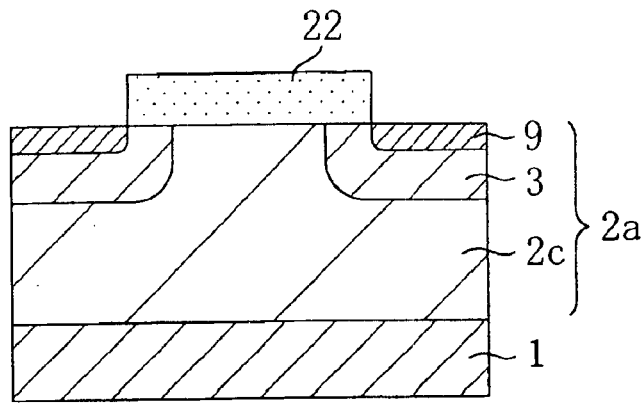
FIGS. 7A through 7D are cross-sectional views illustrating respective process steps for fabricating the SiC-MISFET of the third embodiment.

Before a process step shown in FIG. 7A, the following process step is performed. First, a SiC substrate 1 is prepared. As the SiC substrate 1, for example, a 4H-SiC substrate which has a diameter of 50 mm and whose principal surface has an off-angle of 8 degree from the (0001) plane in the [11-20] direction is used. The SiC substrate 1 is doped with an n-type impurity and has a carrier concentration of $1 \times 10^{18}$ cm$^{-3}$. Next, while performing in-situ doping with an n-type impurity by CVD, a first epitaxial layer 2a including an n-type drift layer 2c, i.e., a storage type SiC-MISFET, is epitaxially grown on the SiC substrate 1. The thickness of the first epitaxial layer 2a (the thickness of the n-type drift layer 2c) is about 10 $\mu$m and the carrier concentration of the n-type drift layer 2c is about $5 \times 10^{15}$ cm$^{-3}$. Thus, a SiC body lower layer including the SiC substrate 1 and the first epitaxial layer 2a is formed.

Subsequently, to form a well region 3 of the storage-type SiC-MISFET, an implantation mask (not shown) made of, for example, nickel (Ni) is formed on a surface of the n-type drift layer 2c. The implantation mask covers part of the n-type drift layer 2c and has an opening corresponding to region of the substrate in which the well region 3 is to be formed. After multiple-stage ion implantation of Al into the n-type drift layer 2c has been performed from above the implantation mask, activation annealing is performed. Thus, part of the n-type drift layer 2c becomes a p-type well region 3 containing an impurity at a concentration of $1 \times 10^{17}$ cm$^{-3}$.

Next, in the process step of FIG. 7A, after the implantation mask of Ni has been removed, an implantation mask 22 made of Al and having openings corresponding to a region of the substrate in which the highly doped contact layer 9 are to be formed is formed. In this case, the opening of the implantation mask 22 includes an entire opening region of an implantation mask used for forming a source region later. Then, after multiple-stage ion implantation of Al ions into the n-type drift layer 2c has been performed from above the implantation mask 22, activation annealing is performed. Thus, a heavily doped contact layer 9 containing a p-type impurity at a concentration of about $2 \times 10^{18}$ cm$^{-3}$ is formed in the n-type drift layer 2c so as to be surrounded by the well region 3.

Figure 7B:
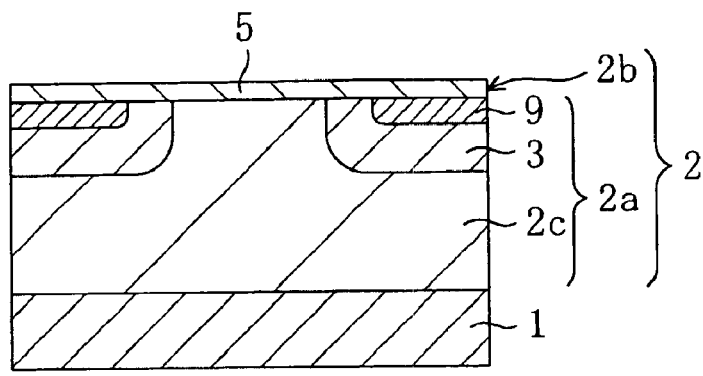

Next, in a process step shown in FIG. 7B, a second epitaxial layer 2b (a SiC body upper layer) including a SiC channel layer 5 containing an n-type impurity and having a thickness of 0.3 $\mu$m is epitaxially grown over the upper surfaces of the well region 3 and the n-type drift layer 2c. The n-type impurity is introduced into the SiC channel layer 5 through in-situ doping, so that the concentration of the n-type impurity therein is about $5 \times 10^{17}$ cm$^{-3}$. Thus, a SiC body including an epitaxial layer 2 and the SiC substrate is formed.

Figure 7C:
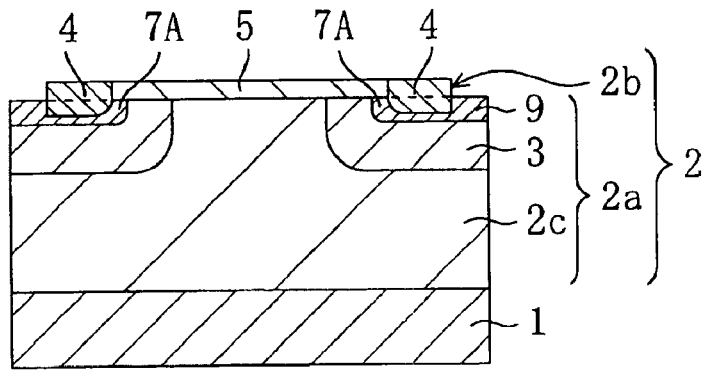

Next, in a process step shown in FIG. 7C, an implantation mask (not shown) made of Ni or the like and having an opening corresponding to a region of the substrate in which a source region 4 is to be formed is formed. After ions of nitrogen which is an n-type impurity have been implanted into the well region 3 from above the implantation mask, activation annealing of nitrogen is performed. Thus, part of the SiC channel layer 5 becomes an n-type source region 4 with a carrier concentration of $2 \times 10^{18}$ cm$^{-3}$. Note that in this embodiment, the p-type impurity concentration of the heavily doped contact layer 9 and the n-type impurity concentration of the source region 4 are almost the same level and the heavily doped contact layer 9 does not changed into the source region 4. However, in FIGS. 6, 7C and 7D, the source region 4 is shown as if a lower portion of the source region 4 enters in the well region 3 for convenience of description.

Figure 7D:
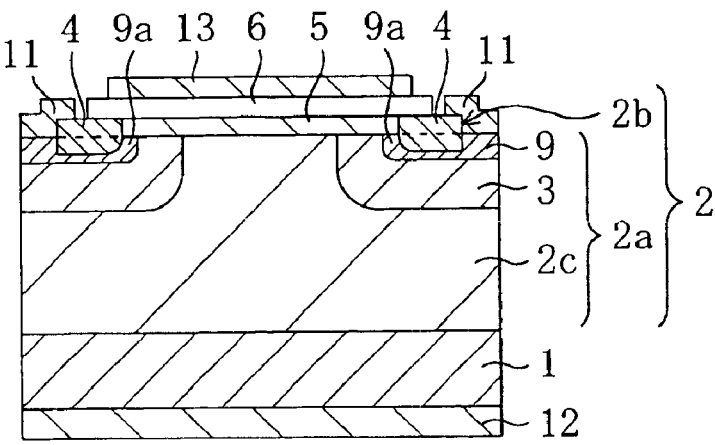

Next, in a process step shown in FIG. 7D, part of surface of the SiC body exposed is thermally oxidized at 1100° C., thereby forming a gate insulation film 6 with a thickness of 30 nm on the upper surface of the substrate. Thereafter, part of the gate insulation film located in a region of the substrate in which a source electrode is to be formed has been removed, Ni is deposited on the upper surface of the source region 4 and the back surface of the SiC substrate 1 by evaporation using an electron beam (EB) evaporation system. Subsequently, by heating the SiC body at 1000° C. in a heat furnace, a source electrode 9 which is to be a first ohmic electrode and a drain electrode 10 which is to be a second ohmic electrode are formed on the source region 4 and the back surface of the SiC substrate 1, respectively. Finally, an aluminum film is deposited on the gate insulation film 6 by evaporation and then the aluminum film is patterned to form a gate electrode 8.

Next, current-voltage characteristics were measured to examine performance of the storage-type SiC-MISFET of this embodiment. The results of the measurements will be described.

For comparison, the known storage-type SiC-MISFET of FIG. 9 was prepared. Note that except that the partially heavily doped layer 9 is not provided, the known storage-type SiC-MISFET was made to have the same structure as that of the storage-type SiC-MISFET of this embodiment.

Then, current-voltage characteristics of the storage-type SiC-MISFET of this embodiment and the known storage-type SiC-MISFET were examined. Specifically, a drain current was measured with a voltage of 0 V applied between the gate electrode and the well region in each of the storage-type SiC-MISFET of this embodiment and the known storage-type SiC-MISFET, and then obtained results were compared.

As a result, it has been clearly shown as in the first embodiment that in the storage-type SiC-MISFET of this embodiment, a drain current was suppressed by almost two digits, compared to the known storage-type SiC-MISFET. Note that it has been also shown that in an ON state with a positive voltage with respect to the well region 3 applied to a gate electrode 13, the respective drain currents of the storage-type SiC-MISFET of this embodiment and the known storage-type SiC-MISFET were almost the same. A possible reason for this seems to be the same as that in the first embodiment.

From the results described above, it has been shown that by forming the heavily doped contact layer 9 in the well region 3 so as to surround the source region 4 and making part of the heavily doped contact layer 9 function as the partially heavily doped layer 9a, a storage-type SiC-MISFET of the normally OFF type in which a drain current in an ON state is not reduced and a drain current does not flow with a voltage of 0V applied between the gate electrode 13 and the well region 3 can be obtained.

More specifically, compared to the first and second embodiments, since the partially heavily doped layer 9a is located far apart from an edge portion of the well region 3, position shifts of the implantation masks caused when ion implantation is performed to form the partially heavily doped layer 9a and the well region 3 can be advantageously ignored. In addition, in this structure, punch through in which a depletion layer formed due to a pn junction between a well region and the drift layer reaches source region is hardly caused. Therefore, breakdown voltage can be increased.

Note that in this embodiment, the p-type impurity concentration of the heavily doped contact layer 9 and the n-type impurity concentration of the source region are almost the same level, and a lower portion of the source region 4 is substantially intrinsic. Accordingly, the substantial thickness of the source region 4 is almost the same as that of the SiC channel layer 5. Even in this structure, the function of the source region 4 is not deteriorated. In the same manner, when the n-type impurity concentration of the source region 4 is lower than the impurity concentration of the heavily doped contact layer 9, i.e., for example, about $1 \times 10^{18}$ cm$^{-3}$, a lower portion of the source region 7 shown in FIG. 6 becomes the heavily doped contact region 9. Even in this structure, the function of the source region 4 is not deteriorated. Furthermore, the n-type impurity concentration of the source region 4 may be greater than that of the p-type impurity concentration of the heavily contact layer 9.

(Fourth Embodiment)

Next, a storage-type SiC-MISFET of the horizontal type according to a fourth embodiment of the present invention in which a partially heavily doped layer containing an impurity at a higher concentration than that in a well region is provided in the well region will be described.

Figure 8:
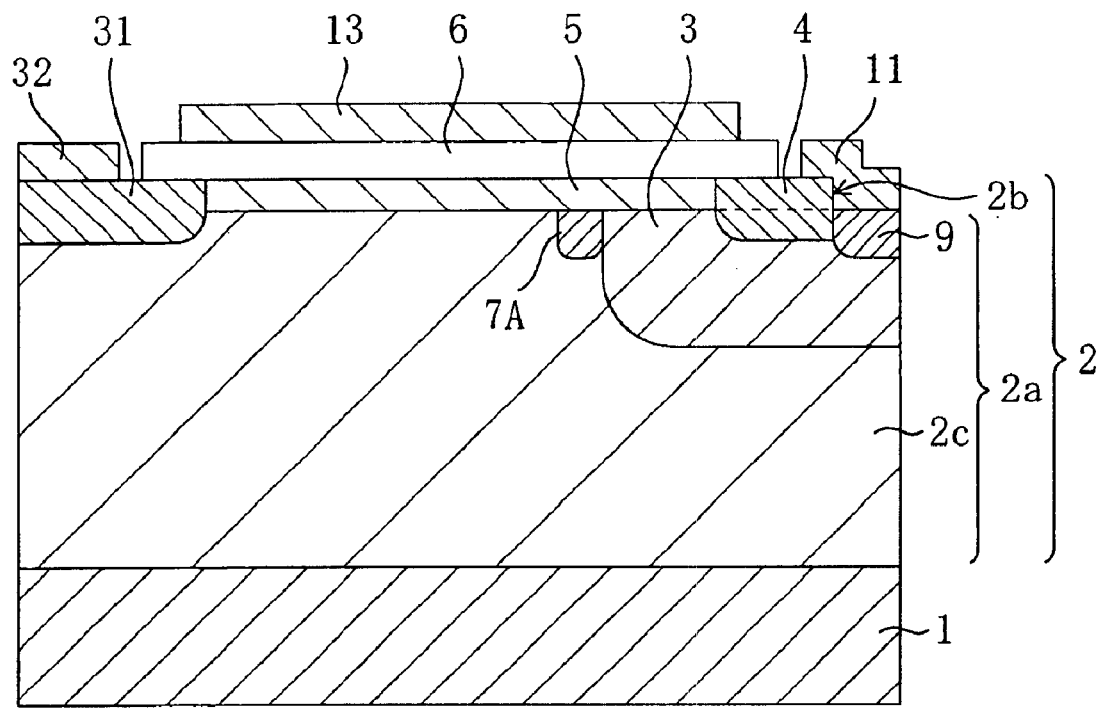
FIG. 8 is a cross-sectional view illustrating the structure of a storage-type SiC-MISFET of a fourth embodiment of the present invention.

FIG. 8 is a cross-sectional view illustrating the structure of the storage-type SiC-MISFET of the fourth embodiment. As shown in FIG. 8, the storage-type SiC-MISFET of this embodiment includes a SiC substrate 1, a first epitaxial layer 2a epitaxially grown on the principal surface of the SiC substrate 1, and a second epitaxial layer 2b epitaxially grown on the first epitaxial layer 2a. The first epitaxial layer 2a includes an n-type drift layer 2c containing an n-type impurity (dopant) formed on the principal surface of the SiC substrate 1, a p-type well region 3 formed by implanting ions of a p-type impurity into the n-type drift layer 2c, and a heavily doped contact layer 9 containing a p-type impurity at a higher concentration than that in the well region 3. Moreover, the second epitaxial layer 2b is formed so that part thereof extends over the well region 3 and the n-type drift layer 2c. The part of the second epitaxial layer 2b forms a SiC channel layer 5, i.e., a storage-type channel layer containing an n-type impurity. Furthermore, the storage-type SiC-MISFET further includes an n-type source region 4 formed by implanting ions of an n-type impurity into another part of the second epitaxial layer 2b and part of the well region 3. Moreover, the storage-type SiC-MISFET further includes a gate insulation film 6 provided on the SiC channel layer 5, a gate electrode 13 provided on the gate insulation film 6, a source electrode 11 which forms an ohmic contact with the source region 4 and the heavily doped contact layer 9. The source region 4 is formed so as to overlap with the gate electrode 13 when viewed from the top and to be in contact with the heavily doped contact layer 9.

Furthermore, the storage-type SiC-MISFET further includes a drain region 31 formed by introducing an n-type impurity into a surface portion of the n-type body portion 2c at about the same concentration as that of the source region 4 and located in a region of the substrate facing to the source region 4 with the SiC channel layer 5 interposed therebetween, and a drain electrode 32 which forms an ohmic contact with the drain region 31.

When the storage-type SiC-MISFET of this embodiment is operated, a current flows from the source region 4 to the drain region 32 via the SiC channel layer 5. Therefore, the storage-type SiC-MISFET of this embodiment has a horizontal type MISFET structure.

In this embodiment, as in the first embodiment, by providing the p-type partially heavily doped layer 7A in the n-type drift layer 2c so as to be in contact with the well region 3, a storage-type SiC-MISFET of the normally OFF type in which a drain current in an ON state and a drain current does not flow with a voltage of 0 V applied between the gate electrode 13 and the well region 3 can be obtained.

Moreover, even if any one of the structures including a partial heavily doped layer in the modified example of the first embodiment, the second embodiment, the modified example of the second embodiment and the third embodiment is applied to a storage-type SiC-MISFET of the horizontal type MISFET, a storage-type SiC-MISFET of the normally OFF type in which a drain current in an ON state is not reduced and a drain current does not flow with a voltage of 0 V applied between the gate electrode 13 and the well region 3 can be obtained.

(Other Embodiments)

Moreover, in each of the above-described embodiments, the case in which the storage-type SiC-MISFET is an n-channel MISFET have been described. However, if an inventive storage-type SiC-MISFET is a p-channel MISFET, the same effects as those of each of the above-described embodiments can be also achieved.

Moreover, in each of the above-described embodiments, a heavily doped layer is formed in the storage-type SiC-MISFET. However, if a heavily doped layer is formed in a storage-type IGBT using SiC, the same effects as those described above can be also achieved.

Moreover, in each of the above-described embodiments, an n-type doped layer having a constant concentration distribution is used as a SiC channel layer. However, if a channel layer including multiple δ doped layers is used, the effects of the present invention can be also achieved.

Moreover, in each of the above-described embodiments, 4H-SiC is used as a SiC substrate. However, a substrate made of other polytypes than 4H-SiC may be used.

The present invention can be utilized as a power semiconductor device or a high frequency semiconductor device provided in various electronic instruments and power instruments.

What is claimed is:

1. A SiC-MISFET comprising:

a SiC body including a body portion containing an impurity of a first conductive type;

a well region formed by introducing an impurity of a second conductive type into part of the SiC body other than the body portion;

a channel layer which is formed so as to extend over the well region and the body portion of the SiC body in the SiC body and contains an impurity of the first conductive type;

a gate insulation film formed on the channel layer;

a gate electrode formed on the gate insulation film;

a source region which is formed in a region of the SiC body located adjacent to the channel layer so as to be in contact with the well region and contains an impurity of the first conductive type;

a drain region formed in a region of the SiC body facing to the source region with the body portion interposed therebetween; and a partially heavily doped layer formed by implanting an impurity of the second conductive type into part of the SiC body located under the channel layer at a higher concentration than that in the well region.

2. The SiC-MISFET of claim 1, wherein a depletion layer formed due to the partial heavily doped layer reaches the gate insulation film with a voltage of 0 V applied between the gate electrode and the well region.

3. The SiC-MISFET of claim 1, wherein at least a lower surface of the partially heavily doped layer is surrounded by the body portion, and wherein the space between the partially heavily doped layer and the well region is shorter than a dimension of the partially heavily doped layer in the gate length direction.

4. The SiC-MISFET of claim 1, wherein the partially heavily doped layer is surrounded by the well region.

5. The SiC-MISFET of claim 4, further comprising a heavily doped contact layer which contains an impurity of the second conductive type at a higher concentration than that in the well region and is connected to the partially heavily doped layer wherein the heavily doped contact layer is formed so as to surround the source region, and wherein the partially heavily doped layer is formed in the same ion implantation process for forming the heavily doped contact layer.

6. The SiC-MISFET of claim 1, wherein a dimension of the partially heavily doped layer in the gate length direction is one tenth or less of a dimension of the channel layer in the gate length direction.

7. The SiC-MISFET of claim 1, wherein a dimension of the partially heavily doped layer in the depth direction is larger than a dimension of the channel layer in the depth direction.

8. The SiC-MISFET of claim 1, wherein the impurity concentration of the partially heavily doped layer is ten times or more higher than that of the well region.

9. The SiC-MISFET of claim 1, wherein the drain region is formed in a lowermost portion of the SiC body and the SiC-MISFET is a vertical type MISFET.

10. The SiC-MISFET of claim 1, wherein the drain region is formed in a surface portion of the SiC body connected to the channel layer and the SiC-MISFET is a horizontal type MISFET.

* * * * *